US012733325B2

(12) United States Patent
Lee et al.

(10) Patent No.: US 12,733,325 B2
(45) Date of Patent: Sep. 8, 2026

(54) DISPLAY DEVICE

(71) Applicant: SAMSUNG ELECTRONICS CO., LTD., Suwon-si (KR)

(72) Inventors: Kwangjae Lee, Suwon-si (KR); Sungsoo Jung, Suwon-si (KR); Pilyong Oh, Suwon-si (KR); Jeongin Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 773 days.

(21) Appl. No.: 18/100,153

(22) Filed: Jan. 23, 2023

(65) Prior Publication Data

US 2023/0155100 A1 May 18, 2023

Related U.S. Application Data

(63) Continuation of application No. PCT/KR2021/008744, filed on Jul. 8, 2021.

(30) Foreign Application Priority Data

Aug. 4, 2020 (KR) ........................ 10-2020-0097125

(51) Int. Cl.
*H10H 20/858* (2025.01)
*B32B 7/022* (2019.01)
(Continued)

(52) U.S. Cl.
CPC ......... *H10H 20/8583* (2025.01); *B32B 7/022* (2019.01); *B32B 7/027* (2019.01);
(Continued)

(58) Field of Classification Search
CPC ............. H10H 20/8583; H10H 20/857; H10H 29/142; B32B 7/022; B32B 7/027;
(Continued)

(56) References Cited

U.S. PATENT DOCUMENTS 6,913,502 B2 7/2005 Park et al.
7,742,120 B2 6/2010 Bayley et al.
(Continued)

FOREIGN PATENT DOCUMENTS

JP 7146516 A 6/1995
JP 8329861 A 12/1996
(Continued)

OTHER PUBLICATIONS

Interview Agenda (Year: 2026).*
(Continued)

*Primary Examiner* — Fernando L Toledo
*Assistant Examiner* — Jorge Andres Lopez
(74) *Attorney, Agent, or Firm* — Sughrue Mion, PLLC

(57) ABSTRACT

A display device a plurality of display modules, each of the plurality of display modules including: a substrate having a mounting surface and a rear surface opposite the mounting surface; a plurality of inorganic light emitting diodes provided on the mounting surface of the substrate; and a frame supporting the plurality of display modules arranged in a matrix, the frame including: a first frame layer contacting the plurality of display modules and including a material having material properties similar to material properties of the substrate; a second frame layer provided behind the first frame layer, and including a metal material; and a third frame layer provided between the first frame layer and the second frame layer and bonding the first frame layer and the second frame layer.

15 Claims, 7 Drawing Sheets

(51) Int. Cl.

*B32B 7/027* (2019.01)
*B32B 7/12* (2006.01)
*B32B 15/04* (2006.01)
*B32B 17/06* (2006.01)
*H05K 7/20* (2006.01)
*H10W 90/00* (2026.01)
*B32B 5/18* (2006.01)
*B32B 15/20* (2006.01)
*B32B 27/06* (2006.01)
*B32B 27/40* (2006.01)

(52) U.S. Cl.

CPC ................ *B32B 7/12* (2013.01); *B32B 15/04* (2013.01); *B32B 17/06* (2013.01); *H05K 7/20963* (2013.01); *H10W 90/00* (2026.01); *B32B 5/18* (2013.01); *B32B 15/20* (2013.01); *B32B 27/06* (2013.01); *B32B 27/40* (2013.01); *B32B 2457/20* (2013.01)

(58) Field of Classification Search

CPC B32B 7/12; B32B 15/04; B32B 17/06; B32B 5/18; B32B 15/20; B32B 27/06; B32B 27/40; B32B 2457/20; B32B 17/061; B32B 17/066; H01L 25/167; H01L 25/0753; H05K 7/20963; G09F 9/30

See application file for complete search history.

(56) References Cited

U.S. PATENT DOCUMENTS 8,240,857 B2 8/2012 Hemphill et al.
9,378,671 B2 6/2016 Kline et al.
9,414,503 B2 8/2016 Lee et al.
10,429,684 B2 10/2019 Naas et al.
10,651,159 B2 5/2020 Adema et al.
10,978,626 B2 4/2021 Park et al.
11,282,820 B2 3/2022 Takeya et al.
11,495,560 B2 11/2022 Prevatte et al.
2007/0132778 A1 6/2007 Gallen et al.
2012/0236509 A1 * 9/2012 Cope ..................... G09G 3/035 361/730
2012/0273808 A1 11/2012 Kim et al.
2017/0178892 A1 6/2017 Sato
2017/0307922 A1 10/2017 Naas et al.
2018/0017993 A1 1/2018 Brooks
2021/0043812 A1 2/2021 Oh et al.
2021/0183837 A1 6/2021 Shin et al.

FOREIGN PATENT DOCUMENTS

JP 2005524876 A 8/2005
JP 4145472 B2 9/2008
JP 4465862 B2 5/2010
JP 5300034 B2 9/2013
JP 5419577 B2 2/2014
JP 2014112220 A 6/2014
JP 2017112220 A 6/2017
JP 2020030409 A 2/2020
KR 1020070028297 A 3/2007
KR 100934636 B1 12/2009
KR 1020140035738 A 3/2014
KR 1020170020485 A 2/2017
KR 1020170093781 A 8/2017
KR 101789126 B1 10/2017
KR 101846609 B1 5/2018
KR 1020180095224 A 8/2018
KR 1020190026617 A 3/2019
KR 1020190083173 A 7/2019
KR 1020190143085 A 12/2019
KR 1020200004688 A 1/2020
KR 1020200021399 A 2/2020
KR 1020210017519 A 2/2021
KR 1020210075820 A 6/2021
KR 1020210131769 A 11/2021
WO WO-2005054935 A2 * 6/2005 ........... G02F 1/1335

OTHER PUBLICATIONS

Communication dated Jul. 28, 2025 issued by the Korean Intellectual Property Office in Korean Patent Application No. 10-2020-0097125.

International Search Report (ISA/210) issued Oct. 27, 2021 by the International Searching Authority in International Application No. PCT/KR2021/008744.

Written Opinion (ISA/237) issued Oct. 27, 2021 by the International Searching Authority in International Application No. PCT/KR2021/008744.

* cited by examiner

DISPLAY DEVICE

CROSS-REFERENCE TO RELATED APPLICATION(S)

This application is a bypass continuation of International Application No. PCT/KR2021/008744, filed on Jul. 8, 2021, in the Korean Intellectual Property Receiving Office, which is based on and claims priority to Korean Patent Application No. 10-2020-0097125, filed on Aug. 4, 2020, in the Korean Intellectual Property Office, the disclosures of which are incorporated by reference herein in their entireties.

BACKGROUND

1. Field

The disclosure relates to a display device displaying an image by combining modules in which a self-luminous inorganic light emitting diodes is mounted on a substrate.

2. Description of Related Art

A display device visually displays data information, such as text and figures, and images.

In general, a liquid crystal display (LCD) panel and an organic light-emitting diode (OLED) panel are mainly used in the display device. However, the LCD panel has a slow response time, and consumes high power. In addition, the LCD panel does not emit light by itself. Above all, because the LCD panel requires a backlight, it is difficult to make the LCD panel slim. An OLED panel is advantageous to make the display device thin because the OLED panel includes self-luminous elements and does not require the backlight. However, OLED panels are vulnerable to a burn-in phenomenon in which specific image remains, such as an afterimage of the LCD panel.

Therefore, a micro-LED panel is being researched as a new panel that may compensate for the shortcomings mentioned above. As for the micro-LED panel, inorganic light emitting diodes are mounted on a substrate and the inorganic light emitting diodes are used as pixels.

The micro-LED panel is one of the flat display panels and is composed of inorganic light emitting diodes of 100 micrometers or less.

The LED panel is a self-luminous element without an OLED burn-in, and has excellent luminance, resolution, power consumption, and durability.

The micro-LED panel has superior contrast, response time, and high energy efficiency compared to the LCD panel, which requires a backlight. Although the OLED and the micro-LED (which is an organic LED), both have good energy efficiency, the micro-LED is superior in brightness, luminous efficiency, and lifespan.

In addition, by arranging micro-LEDs on a circuit board in pixel units, it is possible to manufacture displays as modules in units of substrates, and also with various resolutions and screen sizes according to the customer's order.

SUMMARY

Provided is a display device which may be capable of preventing a reduction in display performance of a part of a screen, which is displayed by a plurality of display modules, caused by heat generated by the display device.

Additional aspects will be set forth in part in the description which follows and, in part, will be apparent from the description, or may be learned by practice of the presented embodiments.

According to an aspect of the disclosure, a display device includes a plurality of display modules, each of the plurality of display modules including: a substrate having a mounting surface and a rear surface opposite the mounting surface; a plurality of inorganic light emitting diodes provided on the mounting surface of the substrate; and a frame supporting the plurality of display modules arranged in a matrix, the frame including: a first frame layer contacting the plurality of display modules and including a material having material properties similar to material properties of the substrate; a second frame layer provided behind the first frame layer, and including a metal material; and a third frame layer provided between the first frame layer and the second frame layer and bonding the first frame layer and the second frame layer.

The substrate and the first frame layer may include the same material.

A ductility of the third frame layer may be greater than a ductility of the first frame layer and a ductility of the second frame layer.

A coefficient of thermal expansion of the first frame layer may be less than a coefficient of thermal expansion of the second frame layer.

The third frame layer may include a first adhesive layer bonded to the first frame layer, a second adhesive layer bonded to the second frame layer, and a high ductility layer provided between the first adhesive layer and the second adhesive layer, and varying in thickness in a direction that the mounting surface faces.

A thickness of the first frame layer in a direction that the mounting surface faces may be less than a thickness of the second frame layer in the direction that the mounting surface faces.

Each of the plurality of display modules may include a metal plate configured to dissipate heat generated from the substrate and facing the rear surface of the substrate and an adhesive member bonding the plurality of display modules to the first frame layer.

Each of the plurality of display modules may include an adhesive layer provided between the rear surface of the substrate and the metal plate, the adhesive layer bonding the rear surface of the substrate and the metal plate, and a ductility of the adhesive layer may be greater than a ductility of the substrate and the metal plate.

The adhesive member may be provided on the metal plate such that the metal plate is bonded to the first frame layer.

The adhesive member may be provided on the rear surface of the substrate such that the substrate is bonded to the first frame layer.

According to an aspect of the disclosure, a display device includes a plurality of display modules, each of the plurality of display modules including: a substrate including a glass material and having a mounting surface; and a plurality of inorganic light emitting diodes mounted on the mounting surface of the substrate; and a frame supporting the plurality of display modules arranged in a matrix, the frame including a glass layer to which the plurality of display modules is bonded.

The frame may include a support layer provided behind the glass layer and supporting the glass layer, and an adhesive layer provided between the glass layer and the support layer and bonding the glass layer and the support layer.

A coefficient of thermal expansion of the glass layer may be less than a coefficient of thermal expansion of the support layer.

The support layer may include a metal material.

A ductility of the adhesive layer may be greater than a ductility of the glass layer and a ductility of the support layer.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
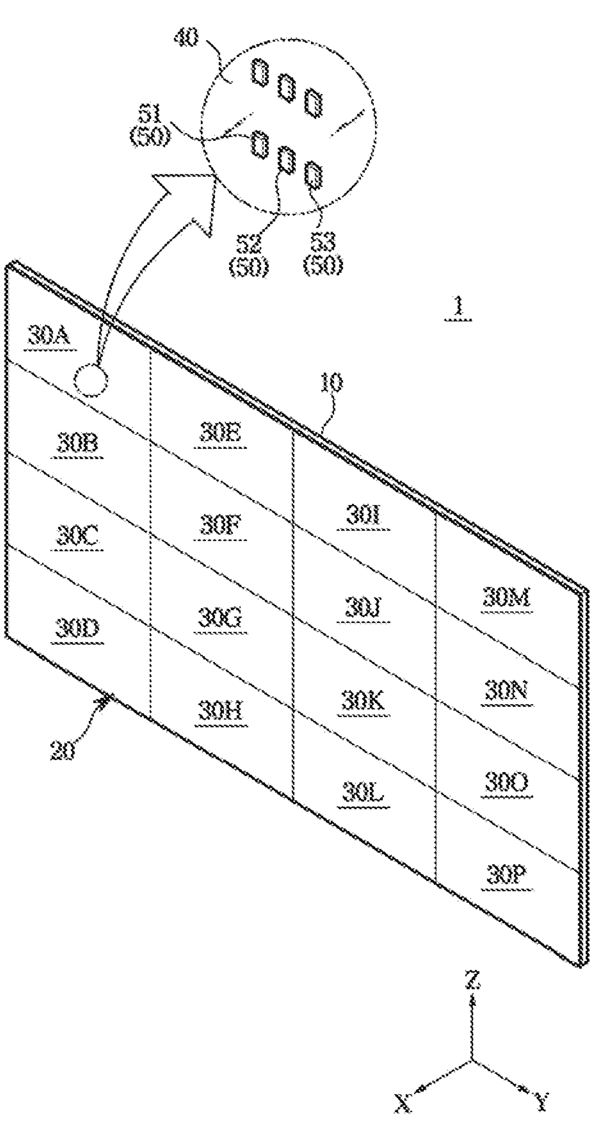
FIG. 1 is a diagram illustrating a display device according to an embodiment of the present disclosure.

The embodiments described herein are merely examples. Accordingly, the described embodiments do not represent all the technical ideas of the disclosure. Therefore, at the time of filing of the disclosure, it should be understood that various equivalents or modifications that can be substituted for the embodiment are also included in the scope of the disclosure.

A singular expression used in the description may include a plural expression unless the context clearly indicates otherwise. The shapes and sizes of elements in the drawings may be exaggerated for a clear description.

In the present specification, terms such as 'comprise' or 'have' are intended to indicate the presence of feature(s), number(s), step(s), operation(s), component(s), part(s), or combinations thereof described in the specification. Accordingly, it should be understood that the existence or addition of one or more other feature(s), number(s), step(s), operation (s), component(s), part(s), or combination(s) thereof is not precluded in advance.

Also, in the present specification, the meaning of 'identical' may indicate that objects having properties similar or contrasting to each other are in a similar state within a certain degree. Also, a word such as 'identical' and 'same' may mean 'substantially the same level of identity'. The meaning of 'substantially the same level' may indicate the degree to which the difference is very small and usually falls within the error range that occurs during manufacturing process.

Hereinafter, a preferred embodiment according to the disclosure will be described in detail with reference to the accompanying drawings.

Figure 2:
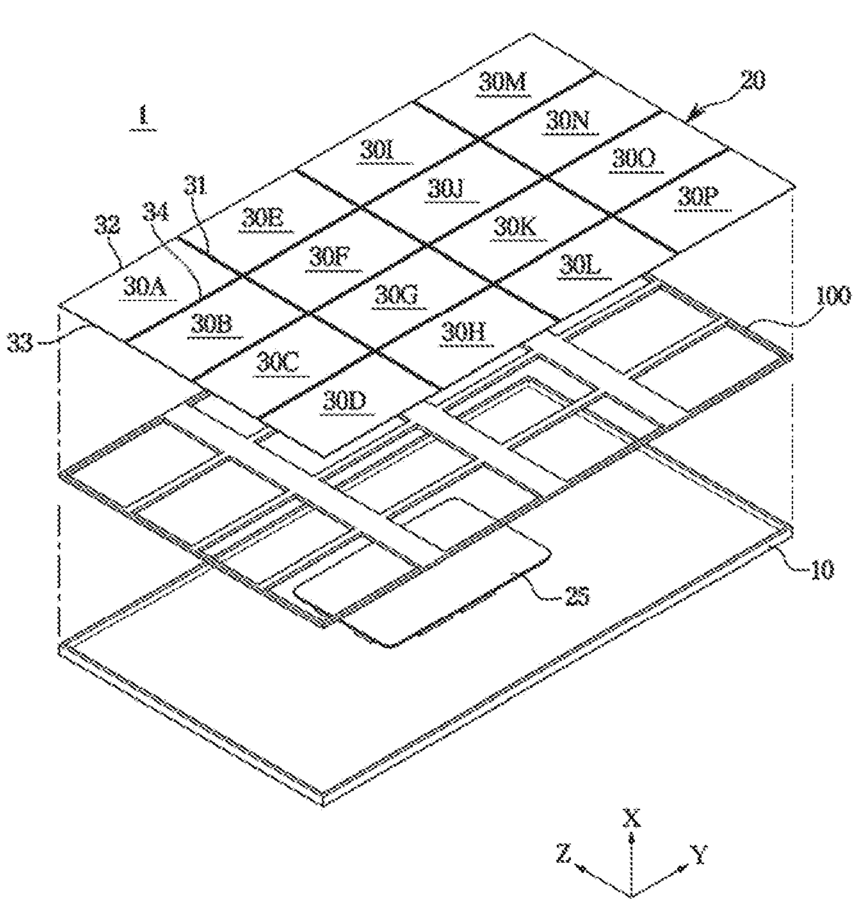
FIG. 2 is a diagram illustrating main configurations of a display device according to an embodiment of the present disclosure.
Figure 3:
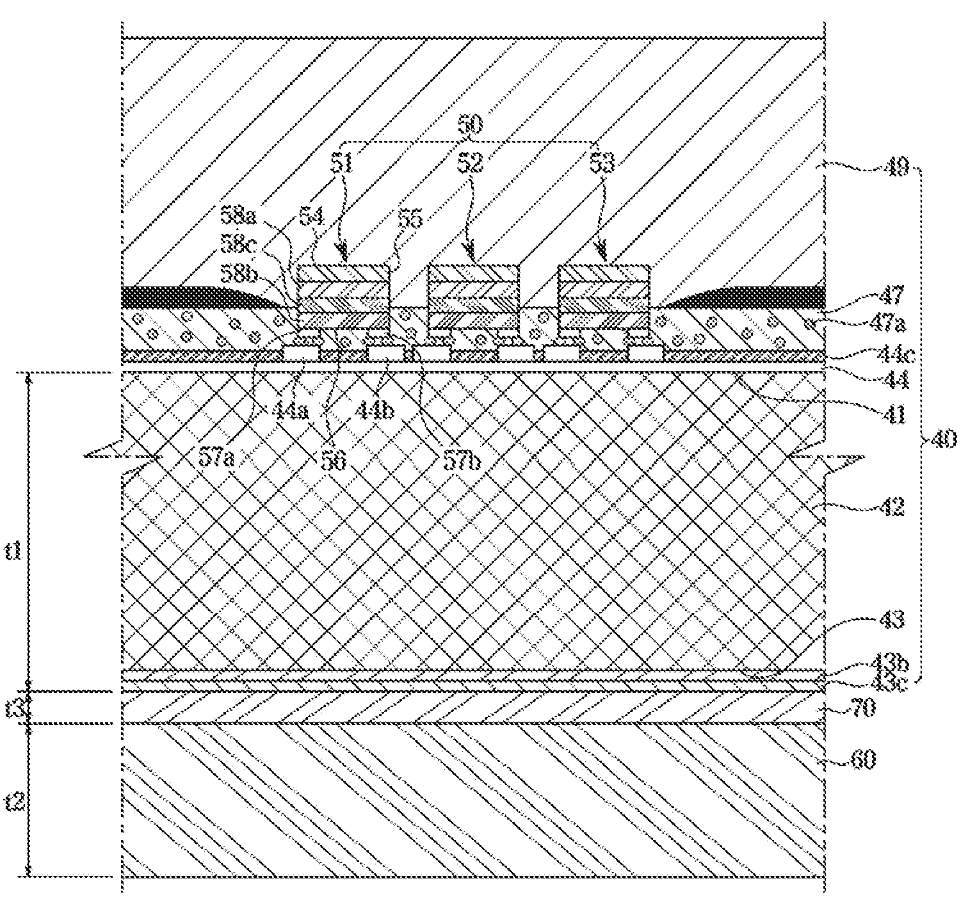
FIG. 3 is a cross-sectional view of a portion of a display module according to an embodiment of the present disclosure.
Figure 4:
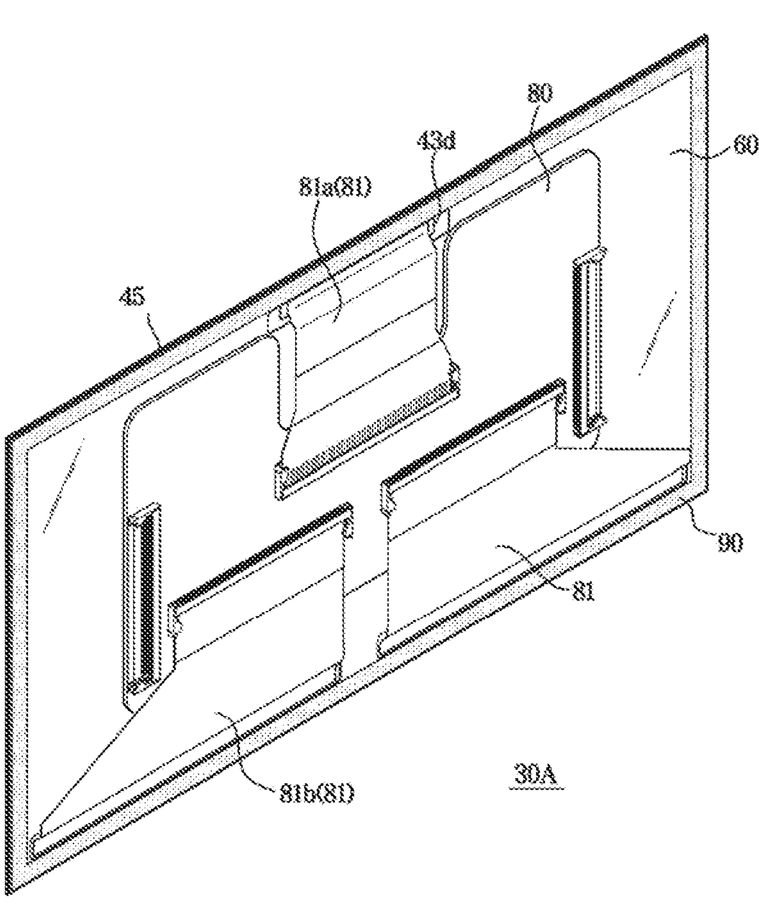
FIG. 4 is a diagram of the display module of a display device according to an embodiment of the present disclosure.

FIG. 1 is a diagram illustrating a display device according to an embodiment of the present disclosure. FIG. 2 is a diagram illustrating main configurations of a display device according to an embodiment of the present disclosure. FIG. 3 is a cross-sectional view of a portion of a display module according to an embodiment of the present disclosure. FIG. 4 is a diagram of the display module of a display device according to an embodiment of the present disclosure.

Some components of a display device 1 including a plurality of inorganic light emitting diodes 50 shown in the drawings are actually very small elements. That is, because the size unit is micrometers, for convenience of explanation, the scales of components such as the plurality of inorganic light emitting diodes 50 and a black matrix 58 are exaggerated.

The display device 1 is an electronic device for displaying information, material, and data as text, figure, graph, and image to a viewer. The display device 1 may be a television (TV), a personal computer (PC), a mobile device, digital signage, etc.

According to an embodiment of the present disclosure, as shown in FIGS. 1 and 2, the display device 1 may include a display panel 20 for displaying an image, power supply circuit for supplying power to the display panel 20, and a main board 25 for controlling the overall operation of the display panel 20. In addition, the display device 1 may include a frame 100 supporting the display panel 20 and a rear cover 10 that covers a rear surface of the frame 100.

The display panel 20 may include a plurality of display modules 30A to 30P and a driving board for driving each of the display modules 30A to 30P. In addition, the display panel 20 may include a timing control board that generates a timing signal required to control each of the display modules 30A to 30P.

The rear cover 10 may support the display panel 20. The rear cover 10 may be combined with a stand or a wall mount to install the display device 1 on a floor or a wall.

The plurality of display modules 30A to 30P may be arranged vertically and horizontally to be adjacent to each other. The plurality of display modules 30A to 30P may be arranged in a matrix of M*N. In this embodiment, 16 display modules are configured as examples, and are arranged in a 4*4 matrix form. However, there is no limitation in the numbers and arrangement of the plurality of display modules.

The plurality of display modules 30A to 30P may be fixed to the frame 100. The plurality of display modules 30A to 30P may be installed in the frame 100 by various known methods such as magnetic force using a magnet, a mechanical fitting method, or adhesion. The rear cover 10 may be coupled to the rear of the frame 100, and the rear cover 10 may form a rear exterior of the display device 1.

The rear cover 10 may be made of a metal material. Accordingly, heat generated by the plurality of display modules 30A to 30P may be easily conducted to the rear cover 10 to increase the heat dissipation efficiency of the display device 1.

As will be described later, the frame 100 and the plurality of display modules 30A to 30P may be bonded to each other by a second adhesive layer 90 disposed behind the plurality of display modules 30A to 30P.

The rear side of the plurality of display modules 30A to 30P may be supported on the frame 100 by the second adhesive layer 90.

As described above, the display device 1 according to an embodiment of the present disclosure may implement a large screen by tiling the plurality of display modules 30A to 30P.

Each of the display modules may be applied to a separate independent display device. That is, each of the display modules 30A to 30P may be applied to a small display device such as a wearable device, a portable device, and a handheld device. The display modules 30A to 30P may be arranged in a matrix form as the embodiment of the disclosure to be applied to a display device such as a monitor for a personal computer, a high-resolution TV, a signage, and an electronic display.

Each of the plurality of display modules 30A to 30P may have the same configuration. Accordingly, the description of the display module described below may be equally applied to all other display modules.

Hereinafter, a first display module 30A among the plurality of display modules 30A to 30P will be described as an example. The first display module 30A may be formed in a quadrangle. The first display module 30A may be provided in a rectangle or a square.

Accordingly, the first display module 30A may include edges 31, 32, 33, and 34 formed at all sides with respect to the first direction X, which is the front.

As shown in FIG. 3, each of the plurality of display modules 30A to 30P may include a substrate 40 and a plurality of inorganic light emitting diodes 50 mounted on the substrate 40. The plurality of inorganic light emitting diodes 50 may be mounted on a mounting surface 41 of the substrate 40 facing the first direction X. In FIG. 3, a thickness of the substrate 40 in the first direction X is exaggerated for convenience of description.

The substrate 40 may be formed in a quadrangle. As described above, each of the plurality of display modules 30A to 30P may be provided in a quadrangle, and the substrate 40 may be formed in a quadrangle to correspond thereto.

The substrate 40 may be provided in a rectangle or a square.

Accordingly, the substrate 40 may include four edges corresponding to the edges 31, 32, 33, and 34 of the first display module 30A based on the first direction X, which is the front.

The substrate 40 may include a base substrate 42, the mounting surface 41 forming one surface of the base substrate 42, a rear surface 43 forming the other surface of the base substrate 42 and disposed opposite to the mounting surface 41, and a side surface 45 connecting the mounting surface 41 and the rear surface 43.

The substrate 40 may include a thin film transistor (TFT) layer 44 formed on the base substrate 42 to drive the inorganic light emitting diodes 50. The base substrate 42 may be a glass substrate. The substrate 40 may be a Chip on Glass (COG) type substrate. First and second pad electrodes 44*a* and 44*b* provided to electrically connect the inorganic light emitting diodes 50 to the TFT layer 44 may be formed on the substrate 40.

The TFT constituting the TFT layer 44 is not limited to a specific structure or type, and may be configured in various embodiments. That is, the TFT of the TFT layer 44 according to an embodiment of the present disclosure may be a Low Temperature Poly Silicon (LTPS) TFT, oxide TFT, Si (poly silicon or a-silicon) TFT, organic TFT, graphene TFT, etc.

Also, in case that the base substrate 42 of the substrate 40 is formed of a silicon wafer, the TFT layer 44 may be replaced with a Complementary Metal-Oxide Semiconductor (CMOS) type, n-type MOS field effect transistor (FET) (MOSFET), or p-type MOSFET transistor.

The plurality of inorganic light emitting diodes 50 may be formed of inorganic materials, and may be elements having sizes of several μm to several tens of μm in width, length, and height, respectively. The micro inorganic light emitting diodes may have a length of 100 μm or less on a short side among width, length, and height. The inorganic light emitting diodes 50 may be picked up from a wafer formed of a sapphire or silicon material and transferred directly onto the substrate 40. The plurality of inorganic light emitting diodes 50 may be picked up and transported by an electrostatic method using an electrostatic head or a stamp method using an elastic polymer material such as polydimethylsiloxane (PDMS) or silicone as a head.

The plurality of inorganic light emitting diodes 50 may have a light emitting structure including an n-type semiconductor 58*a*, an active layer 58*c*, a p-type semiconductor 58*b*, a first contact electrode 57*a*, and a second contact electrode 57*b*.

One of the first contact electrode 57*a* and the second contact electrode 57*b* may be electrically connected to the n-type semiconductor 58*a* and the other may be electrically connected to the p-type semiconductor 58*b*.

The first contact electrode 57*a* and the second contact electrode 57*b* may be horizontally disposed and may be a flip chip type disposed in a direction opposite to the light emission direction.

In case that the inorganic light emitting diodes 50 is mounted on the mounting surface 41, the inorganic light emitting diodes 50 may include a light emitting surface 54 disposed toward the first direction X, a side surface 55, and a bottom surface 56 disposed on the opposite side of the light emitting surface 54. The first contact electrode 57*a* and the second contact electrode 57*b* may be formed on the bottom surface 56.

The contact electrodes 57*a* and 57*b* of the inorganic light emitting diodes 50 are disposed on the opposite side of the light emitting surface 54 and thus may be disposed on the opposite side of the direction in which light is irradiated.

The contact electrodes 57*a* and 57*b* are disposed to face the mounting surface 41, and are electrically connected to the TFT layer 44. The light emitting surface 54 for irradiating light is disposed in a direction opposite to the direction in which the contact electrodes 57*a* and 57*b* are disposed.

Accordingly, when the light generated in the active layer 58*c* is irradiated in the first direction X through the light emitting surface 54, the light may be irradiated toward the first direction X without interference of the first contact electrode 57*a* or the second contact electrode 57*b*.

The first direction X may be defined as a direction to which the light emitting surface 54 emits light.

The first contact electrode 57*a* and the second contact electrode 57*b* may be electrically connected to the first pad electrode 44*a* and the second pad electrode 44*b* formed on the mounting surface 41 of the substrate 40, respectively.

As will be described later, the inorganic light emitting diodes 50 may be directly connected to the pad electrodes 44*a* and 44*b* through an anisotropic conductive layer 47 or a bonding material such as solder.

The anisotropic conductive layer 47 that mediates electrical bonding between the contact electrodes 57*a* and 57*b* and the pad electrodes 44*a* and 44*b* may be formed on the substrate 40. The anisotropic conductive layer 47 may have a structure in which an anisotropic conductive adhesive is attached on a protective film, and conductive balls 47*a* may be dispersed in an adhesive resin. The conductive ball 47*a* may be a conductive sphere surrounded by a thin insulating film, and may electrically connect the conductors to each other in case that the insulating film is broken by pressure.

The anisotropic conductive layer 47 may include an anisotropic conductive film (ACF) in the form of a film and an anisotropic conductive paste (ACP) in the form of a paste.

Therefore, in a state in which the plurality of inorganic light emitting diodes 50 is mounted on the substrate 40, when pressure is applied to the anisotropic conductive layer 47, the insulating film of the conductive ball 47*a* is broken, and thus the contact electrodes 57*a* and 57*b* of the inorganic light emitting diodes 50 may be electrically connected with the pad electrodes 44*a* and 44*b* of the substrate 40.

However, the plurality of inorganic light emitting diodes 50 may be mounted on the substrate 40 through solder instead of the anisotropic conductive layer 47. After the inorganic light emitting diodes 50 is aligned on the substrate 40, the inorganic light emitting diodes 50 may be bonded to the substrate 40 through a reflow process.

The plurality of inorganic light emitting diodes 50 may include a red light emitting diodes 51, a green light emitting diodes 52, and a blue light emitting diodes 53. A series of the red light emitting diodes 51, the green light emitting diodes 52, and the blue light emitting diodes 53, which is as one unit, may be mounted on the mounting surface 41 of the substrate 40. The red light emitting diodes 51, the green light emitting diodes 52, and the blue light emitting diodes 53 may form one pixel. In this case, each of the red light emitting diodes 51, the green light emitting diodes 52, and the blue light emitting diodes 53 may serve as a sub pixel.

The light emitting diodes 51, 52, and 53 may be arranged in a line at a predetermined interval as the embodiment of the disclosure, or may be arranged in a shape other than the disclosure, such as a triangular shape.

The substrate 40 may include a light absorption layer 44*c* to absorb external light to improve contrast. The light absorption layer 44*c* may be formed on the mounting surface 41 of the substrate 40. The light absorption layer 44*c* may be formed between the TFT layer 44 and the anisotropic conductive layer 47.

The plurality of display modules 30A to 30P may further include a black matrix 48 formed between the plurality of inorganic light emitting diodes 50.

The black matrix 48 may serve to supplement the light absorption layer 44*c* formed entirely on the mounting surface 41 of the substrate 40. That is, the black matrix 48 may absorb external light to allow the substrate 40 to appear black, thereby improving the contrast of the screen.

In example embodiments, the black matrix 48 has a black color.

In the present embodiment, it has been described that the black matrix 48 is formed between pixels composed of the light emitting diodes 51, 52, and 53. Alternatively, the black matrix 48 may be more specifically formed to define the light emitting diodes 51, 52, and 53 which are sub-pixels.

The black matrix 48 may be in the form of a grid in which horizontal and vertical straight lines intersect is formed, so as to be arranged between pixels.

The black matrix 48 may be formed by applying a light-absorbing ink on the anisotropic conductive layer 47 and then curing the light-absorbing ink by an ink-jet process. In addition, the black matrix 48 may be formed by coating the anisotropic conductive layer 46 with the light absorption film.

In addition, the black matrix 48 may be formed in a space where the plurality of inorganic light emitting diodes 50 is not mounted on the anisotropic conductive layer 47 formed on the mounting surface 41.

The plurality of display modules 30A to 30P may each include a front cover 49 disposed in the first direction X to cover the mounting surface 41 of the plurality of display modules 30A to 30P.

The front cover 49 may be provided in plurality so as to be respectively disposed on the plurality of display modules 30A to 30P.

The front cover 49 may be in the form of a film. The front cover 49 may include an adhesive layer provided to bond the front cover 49 to the mounting surface 41 of the substrate 40.

The film of the front cover 49 may be provided as a functional film having optical performance.

The front cover 49 may cover the substrate 40 to protect the substrate 40 from external force.

The adhesive layer of the front cover 49 may be provided to have a height greater than or equal to a predetermined height in the first direction X in which the mounting surface 41 or the light emitting surface 54 faces. The height of the adhesive layer is used to fill a gap that may be formed between the front cover 49 and the plurality of inorganic light emitting diodes 50 when the front cover 49 is disposed on the substrate 40.

Each of the display modules 30A to 30P may include a metal plate 60 provided on the rear surface 43 of the substrate 40 to dissipate heat generated from the substrate 40.

In addition, the plurality of display modules 30A to 30P may include a first adhesive layer 70 disposed between the rear surface 43 and the metal plate 60 to bond the metal plate 60 and the rear surface 43 of the substrate 40.

Because pixel driving wirings for driving the plurality of inorganic light emitting diodes 50 are formed on a top wiring layer, the plurality of inorganic light emitting diodes 50 may be electrically connected to the top wiring layer formed on the mounting surface 41.

The top wiring layer may be formed under the anisotropic conductive layer 47. The top wiring layer may be electrically connected to a side wiring formed on the side surface 45 of the substrate 40. The side wiring may be provided in the form of a thin film.

The top wiring layer may be connected to the side wiring by a top connection pad formed on the edge of the substrate 40.

The side wiring may extend along the side surface 45 of the substrate 40 and may be connected to a rear wiring layer 43*b* formed on the rear surface 43.

An insulating layer 43*c* covering the rear wiring layer 43*b* may be formed on the rear wiring layer 43*b* in a direction in which the rear surface of the substrate 40 faces.

That is, the plurality of inorganic light emitting diodes 50 may be sequentially electrically connected to the top wiring layer, the side wiring, and the rear wiring layer 43*b*.

Also, as shown in FIG. 4, the display module 30A may include a driving circuit board 80 for electrically controlling the plurality of inorganic light emitting diodes 50 mounted on the mounting surface 41. The driving circuit board 80 may be a printed circuit board. The driving circuit board 80 may be disposed on the rear surface 43 of the substrate 40 in the first direction X. Although described in detail later, the driving circuit board 80 may be disposed on the metal plate 60 bonded to the rear surface 43 of the substrate 40.

The display module 30A may include a flexible film 81 connecting the driving circuit board 80 and the rear wiring layer 43*b* such that the driving circuit board 80 is electrically connected to the plurality of inorganic light emitting diodes 50.

One end of the flexible film 81 may be connected to a rear connection pad 43*d* disposed on the rear surface 43 of the substrate 40 and electrically connected to the plurality of inorganic light emitting diodes 50.

The rear connection pad 43*d* may be electrically connected to the rear wiring layer 43*b*. Accordingly, the rear connection pad 43*d* may electrically connect the rear wiring layer 43*b* and the flexible film 81.

The flexible film 81 may transmit power and electrical signals from the driving circuit board 80 to the plurality of inorganic light emitting diodes 50 as the flexible film 81 is electrically connected to the rear connection pad 43*d*.

The flexible film 81 may be a flexible flat cable (FFC) or a chip on film (COF).

The flexible film 81 may include a first flexible film 81*a* and a second flexible film 81*b* respectively disposed at different positions with respect to the first direction X.

The first and second flexible films 81*a* and 81*b* are not limited thereto and may be disposed in left and right directions or in at least two directions in the up, down, left, and right directions, respectively, with respect to the first direction X.

The display module 30A may include a plurality of second flexible films 81*b*. However, the disclosure is not limited thereto. The number of the second flexible film 81*b* may be one, and the display module 30*a* may include a plurality of first flexible films 81*a*.

The first flexible film 81*a* may transmit a data signal from the driving circuit board 80 to the substrate 40. The first flexible film 81*a* may be formed of COF.

The second flexible film 81*b* may transmit power from the driving circuit board 80 to the substrate 40. The second flexible film 81*b* may be formed of FFC.

However, the disclosure is not limited thereto. The first and second flexible films 81*a* and 81*b* may be formed in opposite types to each other.

The driving circuit board 80 may be electrically connected to the main board 25 (refer to FIG. 2). The main board 25 may be disposed at the rear of the frame 100, and the main board 25 may be connected to the driving circuit board 80 through a cable at the rear of the frame 100.

As described above, the metal plate 60 may contact the substrate 40. The metal plate 60 and the substrate 40 may be bonded by a first adhesive layer 70 disposed between the rear surface 43 of the substrate 40 and the metal plate 60.

The metal plate 60 may be made of a metal material having high thermal conductivity. For example, the material of the metal plate 60 may be an aluminum.

Heat generated from the plurality of inorganic light emitting diodes 50 and the TFT layer 44 mounted on the substrate 40 may be transferred to the metal plate 60 through the rear surface 43 of the substrate 40 and the first adhesive layer 70.

Accordingly, heat generated from the substrate 40 may be easily transferred to the metal plate 60, and the temperature of the substrate 40 may be prevented from rising above a certain level.

The plurality of display modules 30A to 30P may be arranged to form a matrix of M*N, respectively. Each of the display modules 30A to 30P may be individually disposed. Because each of the display modules 30A to 30P individually includes the metal plate 60, the display modules 30A to 30P may maintain a certain level of dissipation performance regardless of the arrangement.

The plurality of display modules 30A to 30P may form screens of various sizes of the display device 1 in a matrix form of various M*N. Accordingly, because each of the display modules 30A to 30P includes an independent metal plate 60 and each of the display modules 30A to 30P individually dissipate heat, the overall heat dissipation performance of the display device 1 may be improved in comparison with dissipating heat through a single metal plate provided for heat dissipation.

When a single metal plate is disposed inside the display device 1, a portion of the metal plate may not be disposed at a position where some display modules are disposed and the metal plate may be disposed at a position where the display module is not disposed. Accordingly, heat dissipation efficiency of the display device 1 may be reduced.

That is, by the metal plate 60 disposed on each of the display modules 30A to 30P, each of the display modules 30A to 30P dissipates heat by the respective metal plate 60 regardless of position. Accordingly, heat dissipation performance of the display device 1 as a whole may be improved.

The metal plate 60 may be provided in a rectangular shape substantially corresponding to the shape of the substrate 40.

An area of the substrate 40 may be at least equal to or larger than an area of the metal plate 60. While the substrate 40 and the metal plate 60 are disposed side by side in the first direction X, the four edges of the substrate 40 may be disposed to correspond to the four edges of the metal plate 60 with respect to the center of the metal plate 60. Alternatively, the four edges of the substrate 40 may be disposed outside the four edges of the metal plate 60 with respect to the center of the metal plate 60.

The four edges of the substrate 40 may be disposed outside the four edges of the metal plate 60. That is, the area of the substrate 40 may be larger than the area of the metal plate 60.

As will be described later, when heat is generated in each of the display modules 30A to 30P, the substrate 40 and the metal plate 60 may be thermally expanded. Because the coefficient of thermal expansion of the metal plate 60 is higher than the coefficient of thermal expansion of the substrate 40, the metal plate 60 may expand more in volume than the substrate 40.

In case that the four edges of the substrate 40 correspond to the four edges of the metal plate 60 or are disposed inside, the edges of the metal plate 60 may protrude outside the edges of the substrate 40.

Accordingly, gaps between the display modules 30A to 30P arranged in a matrix form may be irregularly formed by thermal expansion of the metal plate 60. Finally, the perception of the seam may be increased and thus the uniformity of the screen of the display panel 20 may be reduced.

However, in case that the four edges of the substrate 40 are disposed outside the four edges of the metal plate 60, even if the substrate 40 and the metal plate 60 are thermally expanded, the four edges of the metal plate 60 do not protrude outward the four edges of the substrate 40. As a result, the gap formed between the display modules 30A to 30P may be kept constant.

Additionally, in order to maintain a constant gap formed between the respective display modules 30A to 30P, the frame 100 supporting each of the display modules 30A to 30P may include a first frame layer 110 having material properties similar to those of the substrate 40. This will be described later in detail.

According to an embodiment of the present disclosure, the area of the substrate 40 and the area of the metal plate 60 may be substantially similar. Accordingly, the heat generated by the substrate 40 may be uniformly dissipated without being isolated in some regions.

The metal plate 60 may be bonded to the rear surface 43 of the substrate 40 by the first adhesive layer 70.

The first adhesive layer 70 may have a size corresponding to size of the metal plate 60. That is, the area of the first adhesive layer 70 may correspond to the area of the metal plate 60. The metal plate 60 may be provided in a substantially rectangular shape, and the first adhesive layer 70 may be provided in a rectangular shape to correspond thereto.

Based on the center of the metal plate 60 and the first adhesive layer 70, the edge of the rectangular metal plate 60 and the edge of the first adhesive layer 70 may be formed to correspond to each other.

As a result, the metal plate 60 and the first adhesive layer 70 may be easily manufactured as a single bonding structure, and thus the manufacturing efficiency of the display device 1 may be increased.

In detail, before cutting one large metal plate into the metal plate 60 of a unit size, the first adhesive layer 70 may be bonded to the metal plate. Because the first adhesive layer 70 and the metal plate 60 are simultaneously cut to a unit size, an effect of reducing the process may occur.

Heat generated from the substrate 40 may be transferred to the metal plate 60 through the first adhesive layer 70. Therefore, the first adhesive layer 70 may serve to bond the metal plate 60 to the substrate 40, and simultaneously transfer heat generated from the substrate 40 to the metal plate 60.

Therefore, the first adhesive layer 70 may be formed of a material having high heat dissipation performance.

Basically, the first adhesive layer 70 may include an adhesive material to bond the substrate 40 and the metal plate 60 together.

Additionally, the first adhesive layer 70 may include a material having higher heat dissipation performance than a material having general adhesive properties. Accordingly, between the substrate 40 and the metal plate 60, the first adhesive layer 70 may efficiently transfer heat to each component.

In addition, the adhesive material of the first adhesive layer 70 may be formed of a material having higher heat dissipation performance than an adhesive material constituting a general adhesive.

The material with high heat dissipation performance means a material that effectively transfers heat with high thermal conductivity, high heat transferability, and low specific heat.

For example, the first adhesive layer 70 may include a graphite material. However, the disclosure is not limited thereto, and the first adhesive layer 70 may be generally made of a material having high heat dissipation performance.

Ductility of the first adhesive layer 70 may be greater than ductility of the substrate 40 and the metal plate 60. Accordingly, the first adhesive layer 70 may be made of a material having high ductility while having adhesive properties and heat dissipation properties. The first adhesive layer 70 may be formed of an inorganic double-sided tape. The first adhesive layer 70 formed of the inorganic tape may be formed as a single layer in which a member, which supports one surface bonded to the substrate 40 and the other surface bonded to the metal plate 60, is not present between the one surface and the other surface.

Because the first adhesive layer 70 does not contain a configuration that prevents heat conduction, the first adhesive layer 70 may have high heat dissipation performance. However, the first adhesive layer 70 is not limited to the inorganic double-sided tape, and may be provided with a heat dissipation tape having better heat dissipation performance than a general double-sided tape.

As described above, the substrate 40 may be made of a glass material, and the metal plate 60 may be made of a metal material. Accordingly, because the material properties of each component are different, the extent to which the material is deformed by the same heat may be different. That is, when heat is generated in the substrate 40, the substrate 40 and the metal plate 60 may expand thermally to different degrees by heat, respectively. Accordingly, the display module 30A may be damaged.

In a state in which the substrate 40 and the metal plate 60 are fixed to each other, because the degree of the expansion of the substrate 40 and the metal plate 60 at the same temperature is different, stress may be generated in each component as the substrate 40 and the metal plate 60 expand to different sizes.

Because the coefficient of thermal expansion of each material is different, the degree to which the material is physically deformed by heat may be different. In particular, because the thermal expansion coefficient of the metal material is generally larger than the thermal expansion coefficient of glass, when the same heat is transferred to the substrate 40 and the metal plate 60, the metal plate 60 may expand and deform more than the substrate 40.

Conversely, even when the substrate 40 and the metal plate 60 are cooled, the metal plate 60 may shrink and deform more than the substrate 40.

Because the substrate 40 and the metal plate 60 are bonded to each other by the first adhesive layer 70 and the metal plate 60 is deformed more than the substrate 40, an external force by the metal plate 60 may be transmitted to the substrate 40.

Conversely, an external force by the substrate 40 may be transmitted to the metal plate 60, but the substrate 40 may be damaged because the rigidity of the glass substrate 40 is smaller than the rigidity of the metal plate 60 made of metal.

The first adhesive layer 70 may be provided between the substrate 40 and the metal plate 60 to absorb external forces which is transmitted to each other while the substrate 40 and the metal plate 60 expand in different sizes.

Accordingly, an external force is transmitted to the substrate 40 and the metal plate 60, and in particular, it is possible to prevent the substrate 40 from being damaged.

The first adhesive layer 70 may be made of a material having high ductility to absorb the external force transmitted from the substrate 40 and the metal plate 60. In other words, the ductility of the first adhesive layer 70 may be greater than the ductility of the substrate 40 and the metal plate 60.

Accordingly, when the external force generated from the size change of the substrate 40 and the metal plate 60 is transmitted to the first adhesive layer 70, the first adhesive layer 70 itself is deformed, and thus the external force may be prevented from being transferred to the different configuration.

The first adhesive layer 70 may have a predetermined thickness in the first direction X. When heat is transferred to the metal plate 60 to thermally expand or contract, the metal plate 60 may expand or contract in a direction orthogonal to the first direction X as well as the first direction X. Accordingly, an external force may be transmitted to the substrate 40.

Even when the metal plate 60 expands or contracts in a direction perpendicular to the first direction X, the thickness of the first adhesive layer 70 may vary, thereby preventing the external force from being transmitted to the substrate 40. Additionally, the thermal expansion coefficient of the first adhesive layer 70 may be different from the thermal expansion coefficient of the substrate 40 and the metal plate 60.

The coefficient of thermal expansion of the first adhesive layer 70 may be greater than that of the substrate 40 and less than the coefficient of thermal expansion of the metal plate 60.

Accordingly, the first adhesive layer 70 may not deform in the same way as either the substrate 40 or the metal plate 60 at the same temperature, and the first adhesive layer 70 may buffer the deformation of each configuration between the substrate 40 and the metal plate 60.

Therefore, the first adhesive layer 70 is disposed between the substrate 40 and the metal plate 60 and deformed to easily absorb the external force generated depending on the difference in thermal expansion rate between the substrate 40 and the metal plate 60.

A thickness t1 of the substrate 40 may be at least twice as thick as a thickness t2 of the metal plate 60 (See FIG. 3).

This is because the rigidity of the metal plate 60 is higher than that of the substrate 40 and thus it is in order to reduce an external force transmitted to the substrate 40 caused by a temporary distortion in the display module 30A due to the thermal expansion.

Because the substrate 40 is formed of a glass material and the metal plate 60 is formed of a metal material, the flatness of the glass plate of the substrate 40 may be provided more uniformly than the flatness of the metal plate.

Therefore, the substrate 40 and the metal plate 60 may be slightly different in flatness. Because the substrate 40 and the metal plate 60 are contact and coupled as described above, stress may be generated in each configuration depending on the degree of flatness.

Because the rigidity of the substrate 40 is low, there is a possibility that the substrate 40 is damaged. To prevent this, the thickness t1 of the substrate 40 may be at least twice as thick as the thickness t2 of the metal plate 60 to reduce the external force transmitted to the substrate 40.

However, this is an example thickness value. The thickness t2 of the metal plate 60 may be thicker than ½ of the thickness t1 of the substrate 40.

The first adhesive layer 70 may have a third thickness t3. The third thickness t3 may be greater than or equal to a minimum length that allows the first adhesive layer 70 to be maintained at a state in which an additional external force is not applied to the substrate 40 when the first adhesive layer 70 is deformed due to the thermal expansion of the metal plate 60 and the substrate 40.

The display module 30A may include a second adhesive layer 90 provided to couple the frame 100 and the display module 30A.

The second adhesive layer 90 may be disposed on the rear surface of the metal plate 60 to allow the metal plate 60 to be bonded to the frame 100.

As described above, the metal plate 60 may be formed to have a size corresponding to the size of the substrate 40 to cover the entire rear surface 43 of the substrate 40. The second adhesive layer 90 may be disposed on the rear surface of the metal plate 60.

However, the disclosure is not limited thereto. The second adhesive layer 90 may be disposed on the rear surface 43 of the substrate 40. In this case, the substrate 40 may be directly bonded to the frame 100 through the second adhesive layer 90.

The metal plate 60 may be provided to cover only a portion of the rear surface 43 of the substrate 40. The second adhesive layer 90 may be bonded to the region of the rear surface 43 of the substrate 40 that is not covered by the metal plate 60.

Accordingly, the display modules 30A to 30P may be directly bonded to the front surface of the first frame layer 110 by the second adhesive layer 90. The first frame layer 110 may form the front surface of the frame 100. The substrate 40 of the display modules 30A to 30P may be formed of a glass material. The display modules 30A to 30P may be bonded to the first frame layer 110 formed of a glass material through the second adhesive layer 90. Therefore, it is possible to minimize a change in the gap between the display modules 30A to 30P that may be caused by thermal expansion. This will be described later in detail.

Hereinafter the frame 100 according to an embodiment of the present disclosure will be described in detail.

Figure 5:
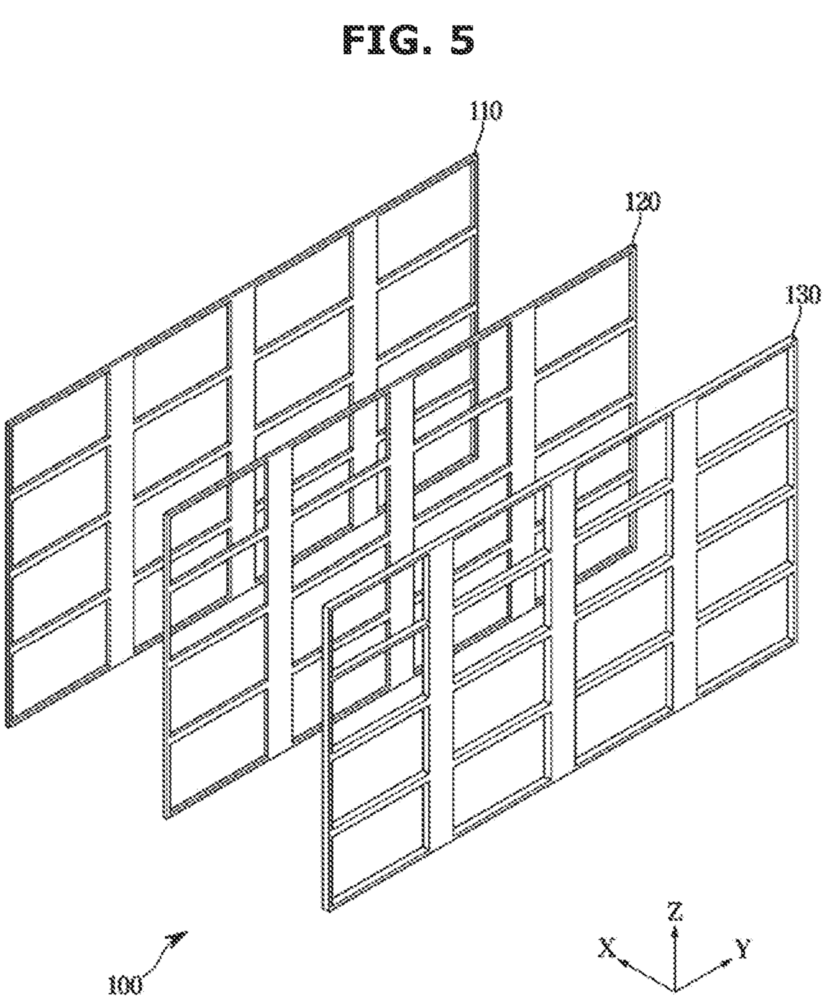
FIG. 5 is a diagram of a frame of a display device according to an embodiment of the present disclosure.
Figure 6:
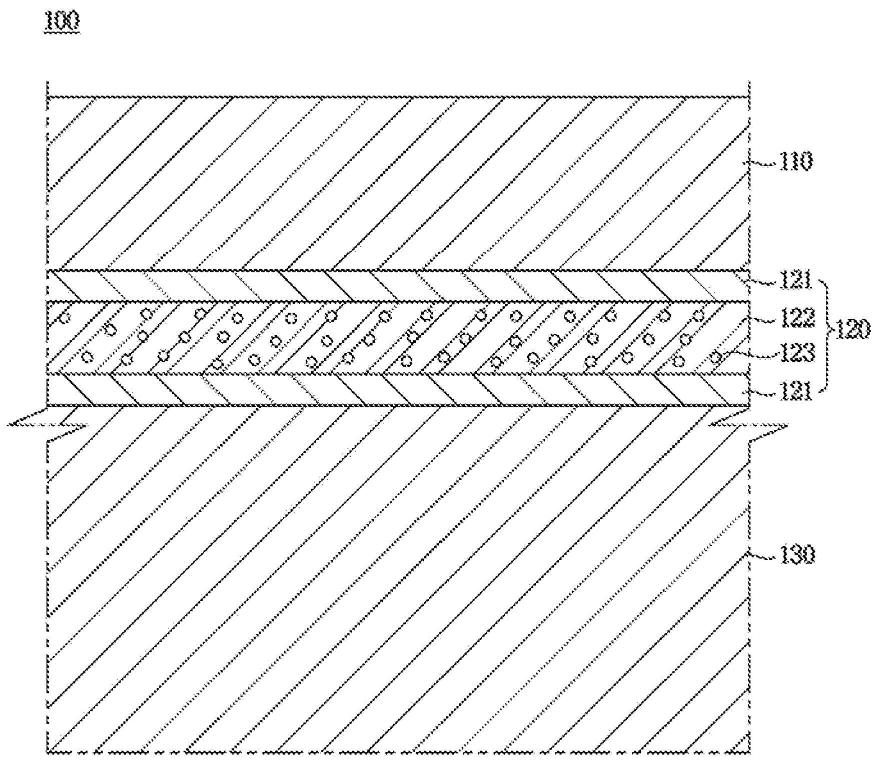
FIG. 6 is a cross-sectional view of a part of the frame of a display device according to an embodiment of the present disclosure.
Figure 7:
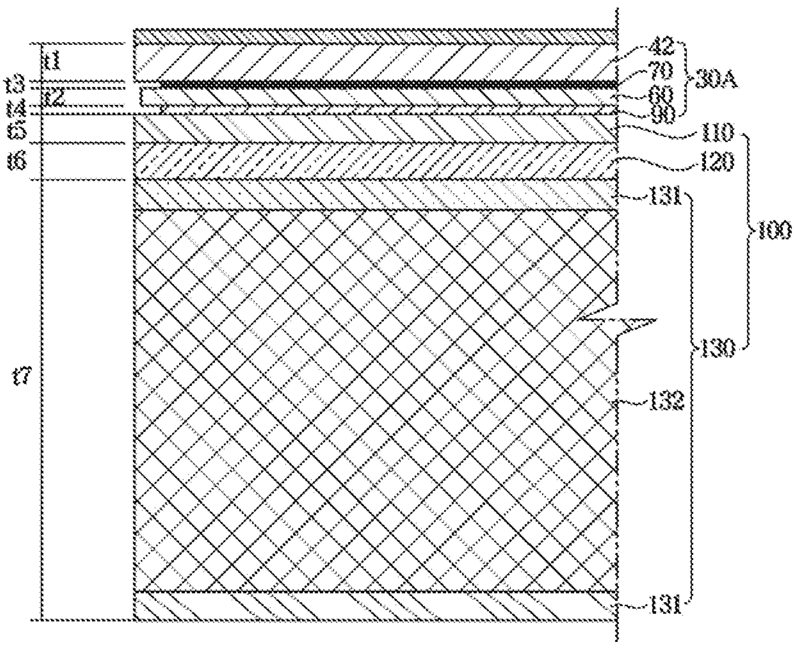
FIG. 7 is a cross-sectional view of a portion of a display device according to an embodiment of the present disclosure.

FIG. 5 is a diagram of a frame of a display device according to an embodiment of the present disclosure. FIG. 6 is a cross-sectional view of a part of the frame of a display device according to an embodiment of the present disclosure. FIG. 7 is a cross-sectional view of a portion of a display device according to an embodiment of the present disclosure.

The screen of the display panel 20 may be configured by the plurality of display modules 30A to 30P as described above. In this case, a seam by the gap formed between the plurality of display modules 30A to 30P may be a factor that may affect the uniformity of the screen.

Accordingly, in order to minimize the perception of the seam of the display panel 20, the plurality of display modules 30A to 30P may be disposed on the frame 100 to form a predetermined gap. This is to prevent a phenomenon in which the perception of the seam is increased due to some gaps when the gaps formed by the plurality of display modules 30A to 30P are not constant.

In addition, the front cover 49 may be provided to absorb light irradiated or reflected toward the gap between the display modules 30A to 30P, so as to minimize the perception of the seam of the display panel 20.

In the case of a conventional display device, a frame supporting the display panel is made of a metal material. A plurality of display modules may be tiled on a metal frame.

The substrate forming the plurality of display modules 30A to 30P may be thermally expanded by heat generated from the display panel while the display device is driven. As described above, because the plurality of display modules 30A to 30P is supported by the frame made of metal, gaps between the plurality of display modules 30A to 30P are irregularly formed due to thermal expansion of the substrate and the frame, and the perception of the seam of the screen may be increased.

That is, substrates of the plurality of display modules 30A to 30P are all made of a glass material and thus each substrate may thermally expand at a constant value. Some gaps between the plurality of display modules 30A to 30P may be irregularly formed due to thermal expansion of the metal frame supporting each substrate. This is because the material properties of the metal material and the material properties of the glass material are different.

The material properties may vary depending on the coefficient of thermal expansion, specific heat, thermal conductivity, and the like. In particular, the degree of thermal expansion between the substrate and the frame may be different due to the difference between the thermal expansion coefficient of the metal and the thermal expansion coefficient of glass.

As the thermal expansion parameter of the substrate of the plurality of display modules 30A to 30P interacts with the thermal expansion parameter of the frame, a gap between the plurality of display modules 30A to 30P may be irregularly formed.

As the plurality of display modules 30A to 30P are arrayed on a metal frame, gaps between the plurality of display modules 30A to 30P are irregularly formed. To prevent this phenomenon, the frame 100 may include the first frame layer 110 to which the plurality of display modules 30A to 30P is bonded, and having material properties similar to those of the substrate 40 of the plurality of display modules 30A to 30P.

The first frame layer 110 may be disposed in front of the frame 100 in the first direction X to which the mounting surface 41 faces.

The plurality of display modules 30A to 30P may be attached to the first frame layer 110 of the frame 100.

The meaning of being formed with a material having material properties similar to material properties of the above-described substrate 40 may include meaning that those of the material are similar to the thermal expansion coefficient, specific heat, and thermal conductivity of the substrate 40. In particular, according to an embodiment of the present disclosure, it could be understood that the coefficient of thermal expansion of the substrate 40 corresponds to the coefficient of thermal expansion of the first frame layer 110.

In detail, when the same heat is transferred to the substrate 40 and the first frame layer 110 in the second direction Y or the third direction Z orthogonal to the first direction X, the substrate 40 and the first frame layer 110 may be expanded to a length corresponding to each other.

The first frame layer 110 may be made of a material having a thermal expansion coefficient similar to that of the substrate 40. The first frame layer 110 may be formed of a material having the same thermal expansion coefficient as that of the substrate 40.

The substrate 40 and the first frame layer 110 may be formed of a glass material. Accordingly, the thermal expansion coefficients of the substrate 40 and the first frame layer 110 may be the same.

Because the first frame layer 110 is formed of a glass material, the first frame layer 110 may be referred to as a glass layer 110, but hereinafter, it will be referred to as the first frame layer 110.

Accordingly, when heat is generated while the display device 1 is driven, the substrate 40 of the plurality of display modules 30A to 30P and the first frame layer 110 may thermally expand to the same value.

Because the first frame layer 110, to which the plurality of display modules 30A to 30P is bonded, thermally expands to the same value as that of the substrate 40, the gap formed between the plurality of display modules 30A to 30P may be maintained constantly.

Accordingly, because the gap formed between the plurality of display modules 30A to 30P is maintained at the same distance, the seam may be maintained at the certain extent and thus the display panel 20 may always have the same screen integrity or uniformity.

Even when heat generated by driving the display device 1 is supplied to the substrate 40 of the plurality of display modules 30A to 30P, the gap between the plurality of display modules 30A to 30P may be constant. As a result, it is possible to prevent a phenomenon in which the integrity of the screen is deteriorated caused by the enlarged seam.

As shown in FIG. 5, the frame 100 may include the first frame layer 110 contacting the plurality of display modules 30A to 30P and having the same coefficient of thermal expansion as that of the substrate 40. The first frame layer 110 may be made of a glass material. The frame 100 may include a second frame layer 130 disposed behind the first frame layer 110 in a direction to which the mounting surface 41 faces. The second frame layer 130 may support the first frame layer 110. The frame 100 may include a third frame layer disposed between the first frame layer 110 and the second frame layer 130 in a direction to which the mounting surface 41 faces. The third frame layer may be provided to bond the first frame layer 110 and the second frame layer 130 to each other.

The third frame layer 120 may be referred to as an adhesive layer. However, in order to prevent mixing of the names of the above-described first adhesive layer 70 and the second adhesive layer 90, it may be referred to as a 'third adhesive layer'. However, hereinafter it will be referred to as the third frame layer 120.

Also, the second frame layer 130 may be referred to as a support layer 130. However, hereinafter it will be referred to as the second frame layer 130.

The frame 100 may be configured to support the display panel 20 and may be provided to have a rigidity greater than or equal to a predetermined level. In this case, when the frame 100 is formed using only the first frame layer 110 described above, it may be difficult to secure a certain level of rigidity. Therefore, the frame 100 may additionally include the second frame layer 130 supporting the first frame layer 110.

The second frame layer 130 may include a metal material to secure rigidity.

The second frame layer 130 may be formed only of a metal material, but may be formed by a combination of a metal plate formed of a metal material and a foam member bonded to the metal plate.

In order to secure the rigidity of the frame 100, the thickness of the first frame layer 110 with respect to the direction to which the mounting surface faces may be less than the thickness of the second frame layer 130. The first frame layer 110 may be configured to maintain a gap between the plurality of display modules 30A to 30P. However, because the second frame layer 130 supports the plurality of display modules 30A to 30P, it is required that the second frame layer 130 has high rigidity.

Because the second frame is a configuration that supplements the first frame layer 110 formed of a glass material having low rigidity, the frame 100 may stably support the display panel 20 by the second frame layer 130.

In order to secure a certain level of rigidity or more, the second frame layer 130 may be formed to be thicker than the first frame layer 110 in the direction to which the mounting surface 41 faces.

Each of the layers 110, 120, and 130 may be sequentially disposed in the order of the first frame layer 110, the third frame layer 120, and the second frame layer 130 based on the direction to which the mounting surface 41 faces.

The coefficient of thermal expansion of the first frame layer 110 may be less than that of the second frame layer 130. This is because the first frame layer 110 is formed of a material similar to that of the substrate 40, and the second frame layer 130 is formed of the metal material to support the first frame layer 110 as described above.

In general, because the substrate of the display module is formed of a glass material, the first frame layer 110 may be formed of a glass material, and the second frame layer 130 includes a metal material to secure rigidity. Accordingly, the first frame layer 110 may be provided to have a lower coefficient of thermal expansion than that of the second frame layer 130.

The first frame layer 110 and the second frame layer 130 are bonded to each other by the third frame layer 120. Accordingly, when the second frame layer 130 is deformed more than the first frame layer 110, an external force may be transmitted to the first frame layer 110. When heat is supplied to the frame 100, the second frame layer 130 including the metal material may expand more than the first frame layer 110 formed of the glass material.

Alternatively, an external force by the first frame layer 110 may be transmitted also to the second frame layer 130. Because the rigidity of the first frame layer 110 made of glass is smaller than that of the second frame layer 130 made of metal, the first frame layer 110 may be damaged.

In order to prevent the first frame layer 110 from being damaged, the third frame layer 120 may be provided to absorb external forces. The third frame layer 120 may be disposed between the first frame layer 110 and the second frame layer 130 to absorb external forces which is transmitted to each other while the substrate 40 and the metal plate 60 expand in different sizes.

Accordingly, example embodiments may prevent the external force from being transmitted to the first frame layer 110 and the second frame layer 130 and particularly, example embodiments may prevent the first frame layer 110 from being damaged.

The third frame layer 120 may be made of a material having high ductility. In other words, the ductility of the third frame layer 120 may be greater than the ductility of the first frame layer 110 and the second frame layer 130.

It is in order to prevent the external force, which is generated by the change in the size of the first frame layer 110 and the second frame layer 130 due to the thermal expansion, from being transmitted to the first frame layer 110 and the second frame layer 130.

That is, the external force generated by the first frame layer 110 and the second frame layer 130 may be applied to each component through the third frame layer 120 disposed between the first frame layer 110 and the second frame layer 130.

As described above, the ductility of the third frame layer 120 may be greater than the ductility of the first frame layer 110 and the second frame layer 130. Due to the high ductility of the third frame layer 120, the external force transmitted to the third frame layer 120 is used to deform the third frame layer 120 itself. As a result, because the transmitted external force is consumed for deformation of the third frame layer 120, the external force is not transmitted to the first frame layer 110 and the second frame layer 130.

The third frame layer 120 may have a predetermined thickness t6 in the first direction X (refer to FIG. 7). When the second frame layer 130 is thermally expanded or contracted by the heat, the second frame layer 130 may transmit an external force to the metal plate 60 and the substrate 40. The direction in which the external force acts may be a direction orthogonal to the first direction X.

Even if the second frame layer 130 expands or contracts in a direction orthogonal to the first direction X, the thickness t6 of the third frame layer 120 is changed in the first direction X, and transmission of external force to the first frame layer 110 may be prevented because the third frame layer 120 has a predetermined thickness t6 in the first direction X.

In addition, even if a portion of the second frame layer 130 expands in the first direction X due to distortion occurring as the second frame layer 130 thermally expands, because the third frame layer 120 has the predetermined thickness t6 in the first direction X, the thickness t6 of the third frame layer 120 may be changed in the first direction X to offset the distortion of the second frame layer 130 to prevent the external force from being transmitted to the first frame layer 110.

Additionally, the thermal expansion coefficient of the third frame layer 120 may be different from the thermal expansion coefficient of the first frame layer 110 and the second frame layer 130.

Accordingly, as the third frame layer 120 deforms itself, the third frame layer 120 may easily absorb an external force generated according to a difference in thermal expansion coefficient. The third frame layer 120 may be disposed between the first frame layer 110 and the second frame layer 130 to easily absorb an external force generated according to a difference in thermal expansion coefficient.

As shown in FIG. 6, the third frame layer 120 may include a first adhesive layer 121 bonded to the first frame layer 110, a second adhesive layer 122 bonded to the second frame layer 130, and a high ductility layer 123 disposed between the first adhesive layer 121 and the second adhesive layer 122. The high ductility layer 123 may be provided to allow the thickness of the high ductility layer 123 to vary in the direction of the mounting surface 41.

The first and second adhesive layers 121 and 122 may be configured to bond the first frame layer 110 and the second frame layer 130 to each other, and may be made of the same material.

The high ductility layer 123 may be made of a polyurethane material.

The high ductility layer 123 may be provided as a foam layer including a plurality of air bubbles 124. The high ductility layer 123 may be provided to have high ductility by the plurality of bubbles 124 therein.

The high ductility layer 123 may be easily deformed in the direction to which the mounting surface 41 faces or the direction perpendicular to the direction to which the mounting surface 41, by the plurality of air bubbles 124 therein. A void space may be formed in the high ductility layer 123 by the plurality of air bubbles 124. The high ductility layer 123 may be easily deformed by the void space.

When the first frame layer 110 and the second frame layer 130 thermally expand to different degrees by thermal expansion, and external forces of different degrees are transmitted to the third frame layer 120, the third frame layer 120 may not transmit an external force to each other. Because of the high ductility layer 123, the third frame layer 120 may consume the transmitted external force in its deformation.

Even if the first frame layer 110 and the second frame layer 130 have different thermal expansion coefficients, and even if heat is supplied to the frame 100 by the third frame layer 120, it is possible to prevent the first frame layer 110 having a lower rigidity than the second frame layer 130 from being damaged.

The third frame layer 120 may be provided as a double-sided adhesive tape having the plurality of layers 121, 122, and 123 described above.

As shown in FIG. 7, the second frame layer 130 may be formed of a metal layer 131 formed of a metal material and a foamed resin layer 132 formed of a foamed resin.

Also, the second frame layer 130 may be formed of a single metal plate. However, as long as a certain level of rigidity is secured by the metal layer 131 and the foamed resin layer 132 having a predetermined thickness, the second frame layer 130 may include the metal layer 131 and the foamed resin layer 132.

In case that the second frame layer 130 includes the foamed resin layer 132, the amount of metal used to form the second frame layer 130 may be reduced. Accordingly, the weight of the second frame layer 130 may be reduced, and the production cost of the second frame layer 130 may be reduced.

As described above, the thickness t1 of the base substrate 42 of the substrate 40 may be approximately twice as thick as the thickness t2 of the metal plate 60.

The third thickness t3 of the first adhesive layer 70 may be greater than or equal to a minimum length that allows the first adhesive layer 70 to be maintained at a state in which an additional external force is not applied to the substrate 40 when the first adhesive layer 70 is deformed due to the thermal expansion of the metal plate 60 and the substrate 40.

The thickness t4 of the second adhesive layer 90 may be greater than or equal to a minimum thickness that maintains adhesion between the display module 30A and the frame 100.

In order to secure rigidity, the thickness t7 of the second frame layer 130 may be greater than the thickness t5 of the first frame layer 110 and the thickness t6 of the third frame layer 120.

Alternatively, in case that a larger number of display modules than the plurality of display modules 30A to 30P are supported by the frame 100, the thickness t7 of the second frame layer 130 and the thickness t5 of the first frame layer 110 may be increased.

In addition, the area of the second frame layer 130 and the first frame layer 110 may be formed to be larger than the sum of the areas of the plurality of display modules 30A to 30P.

When a larger number of display modules than the plurality of display modules 30A to 30P are supported by the frame 100, the weight of the display panel 20 increases, and thus additional rigidity of the frame 100 may be required.

That is, as the size of the screen of the display panel 20 increases, the thickness t7 of the second frame layer 130 and the thickness t5 of the first frame layer 110 may be increased.

The thickness t6 of the third frame layer 120 may be greater than or equal to a minimum length that allows the third frame layer 120 to be maintained at a state in which an additional external force is not applied to the first frame layer 110 when the third frame layer 120 is deformed due to the thermal expansion of the first frame layer 110 and the second frame layer 130.

The thickness t6 of the third frame layer 120 may be variously formed depending on the materials of the first adhesive layer 121, the second adhesive layer 122, and the high ductility layer 123. That is, in the case of the disclosure, the thickness t6 of the third frame layer 120 may be approximately equal to or less than the thickness t5 of the first frame layer 110. However, the disclosure is not limited thereto, and the thickness t6 of the third frame layer 120 may be ½ or less than the thickness t5 of the first frame layer 110 depending on the materials of the first adhesive layer 121, the second adhesive layer 122, and the high ductility layer 123.

A display device may include a frame formed of the same material as a material of a substrate of a plurality of display modules and the frame may include a portion to which the substrate of the plurality of display modules is bonded. When the substrate is thermally expanded by heat generated in the display device, the portion of the frame to which the plurality of display modules is bonded may be thermally expanded to the same level as the substrate. Accordingly, because a gap between the plurality of display modules is maintained at a certain level, it is possible to prevent an increase in a seam that may occur between the plurality of display module.

While the present disclosure has been particularly described with reference to exemplary embodiments, it should be understood by those of skilled in the art that various changes in form and details may be made without departing from the spirit and scope of the present disclosure.

What is claimed is:

1. A display device comprising:

a plurality of display modules, each of the plurality of display modules comprising:

a substrate having a mounting surface and a rear surface opposite the mounting surface;

a plurality of inorganic light emitting diodes provided on the mounting surface of the substrate; and a frame supporting the plurality of display modules arranged in a matrix, the frame comprising:

a first frame layer contacting the plurality of display modules and comprising a material having a thermal expansion coefficient corresponding to a thermal expansion coefficient of a material of the substrate;

a second frame layer provided behind the first frame layer, and comprising a metal material; and a third frame layer provided between the first frame layer and the second frame layer and bonding the first frame layer and the second frame layer.

2. The display device of claim 1, wherein the substrate and the first frame layer comprise the same material.

3. The display device of claim 1, wherein a ductility of the third frame layer is greater than a ductility of the first frame layer and a ductility of the second frame layer.

4. The display device of claim 3, wherein a coefficient of thermal expansion of the first frame layer is less than a coefficient of thermal expansion of the second frame layer.

5. The display device of claim 1, wherein the third frame layer comprises:

a first adhesive layer bonded to the first frame layer;

a second adhesive layer bonded to the second frame layer; and a high ductility layer provided between the first adhesive layer and the second adhesive layer, and varying in thickness in a direction in which the mounting surface faces.

6. The display device of claim 1, wherein a thickness of the first frame layer in a direction in which the mounting surface faces is less than a thickness of the second frame layer in the direction in which the mounting surface faces.

7. The display device of claim 1, wherein each of the plurality of display modules further comprises:

a metal plate configured to dissipate heat generated from the substrate and facing the rear surface of the substrate; and an adhesive member bonding the plurality of display modules to the first frame layer.

8. The display device of claim 7, wherein each of the plurality of display modules further comprises an adhesive layer provided between the rear surface of the substrate and the metal plate to bond the rear surface of the substrate and the metal plate, and wherein a ductility of the adhesive layer is greater than a ductility of the substrate and the metal plate.

9. The display device of claim 7, wherein the adhesive member is provided on the metal plate to bond the metal plate to the first frame layer.

10. The display device of claim 7, wherein the adhesive member is provided on the rear surface of the substrate to bond the substrate to the first frame layer.

11. A display device comprising:

a plurality of display modules, each of the plurality of display modules comprising:

a substrate comprising a glass material and having a mounting surface; and a plurality of inorganic light emitting diodes mounted on the mounting surface of the substrate; and a frame supporting the plurality of display modules arranged in a matrix, the frame comprising a glass layer to which the plurality of display modules is bonded.

12. The display device of claim 11, wherein the frame further comprises:

a support layer provided behind the glass layer and supporting the glass layer; and an adhesive layer provided between the glass layer and the support layer and bonding the glass layer and the support layer.

13. The display device of claim 12, wherein a coefficient of thermal expansion of the glass layer is less than a coefficient of thermal expansion of the support layer.

14. The display device of claim 13, wherein the support layer comprises a metal material.

15. The display device of claim 12, wherein a ductility of the adhesive layer is greater than a ductility of the glass layer and a ductility of the support layer.

* * * * *